(12) United States Patent
Adachi et al.

(10) Patent No.: US 12,074,090 B2
(45) Date of Patent: Aug. 27, 2024

(54) SEMICONDUCTOR APPARATUS

(71) Applicant: FUJI ELECTRIC CO., LTD., Kawasaki (JP)

(72) Inventors: Shinichiro Adachi, Kawasaki (JP); Kazuo Enomoto, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 220 days.

(21) Appl. No.: 17/461,693

(22) Filed: Aug. 30, 2021

(65) Prior Publication Data

US 2022/0122902 A1 Apr. 21, 2022

(30) Foreign Application Priority Data

Oct. 15, 2020 (JP) .................................. 2020-173649

(51) Int. Cl.
| | |
|---|---|
| *H01L 23/46* | (2006.01) |
| *H01L 23/31* | (2006.01) |
| *H01L 23/498* | (2006.01) |
| *H01L 25/07* | (2006.01) |
| *H01L 23/00* | (2006.01) |
| *H01L 23/32* | (2006.01) |

(52) U.S. Cl.
CPC .......... *H01L 23/46* (2013.01); *H01L 23/3121* (2013.01); *H01L 23/49811* (2013.01); *H01L 25/072* (2013.01); *H01L 23/32* (2013.01); *H01L 24/73* (2013.01); *H01L 2224/73263* (2013.01)

(58) Field of Classification Search
CPC ...... H01L 23/46; H01L 23/473; H01L 23/367
See application file for complete search history.

(56) References Cited

U.S. PATENT DOCUMENTS

| | | | |
|---|---|---|---|
| 10,796,981 B1* | 10/2020 | Chiang | ............. H01L 23/49575 |
| 2009/0065178 A1 | 3/2009 | Kasezawa et al. | |
| 2010/0232112 A1 | 9/2010 | Uechi et al. | |
| 2013/0264702 A1* | 10/2013 | Nishi | .................. H01L 23/3735 |
| | | | 257/712 |
| 2020/0227333 A1* | 7/2020 | Tsuyuno | ............. H01L 23/4334 |

FOREIGN PATENT DOCUMENTS

| | | | |
|---|---|---|---|
| JP | 2010-212577 A | | 9/2010 |
| JP | 2011-040778 A | | 2/2011 |
| JP | 2012-049167 A | | 3/2012 |
| JP | 2012049167 A | * | 3/2012 |

* cited by examiner

*Primary Examiner* — Michele Fan
(74) *Attorney, Agent, or Firm* — Rabin & Berdo, P.C.

(57) ABSTRACT

A semiconductor apparatus includes a cooler including a bottom plate, a plurality of fins disposed on the bottom plate, and a cover member including a fin cover member and a plate cover member. The fin cover member covers the plurality of fins and has a heat dissipation outer surface. The plate cover member surrounds an outer periphery of the fin cover member, is disposed on the bottom plate, and has a plate cover surface. The apparatus further includes an insulating substrate on the heat dissipation outer surface, a semiconductor element on the insulating substrate, and an insulating member on the plate cover surface, to seal the insulating substrate and the semiconductor element. The plate cover surface is position closer to the bottom plate than is the heat dissipation outer surface with respect to a height direction orthogonal to the bottom plate.

19 Claims, 9 Drawing Sheets

FIG.10

SEMICONDUCTOR APPARATUS

CROSS REFERENCE TO RELATED APPLICATIONS

This application is based upon and claims the benefit of priority of the prior Japanese Patent Application No. 2020-173649, filed on Oct. 15, 2020, the entire contents of which are incorporated herein by reference.

BACKGROUND OF THE INVENTION

Field of the Invention

The present invention relates to a semiconductor apparatus.

Description of the Related Art

A semiconductor module has a substrate having thereon a semiconductor element such as an insulated gate bipolar transistor (IGBT), a power metal oxide semiconductor field effect transistor (MOSFET) and a free wheeling diode (FWD) and is utilized in, for example, an inverter apparatus.

A semiconductor apparatus has been known in which a semiconductor module of the type above and a cooler are integrated. A specific configuration thereof is disclosed in, for example, Japanese Patent Laid-Open No. 2012-49167.

A semiconductor apparatus disclosed in Japanese Patent Laid-Open No. 2012-49167 has a semiconductor element disposed on a cooler through a base plate. Heat caused by an operation of the semiconductor module is dissipated through a coolant that circulates within the cooler. Thus, the semiconductor module is cooled.

When an internal structure of a semiconductor module including a semiconductor element is exposed, there is a risk that the internal structure is, for example, damaged by an external factor. Accordingly, a semiconductor apparatus is in actual use which has a structure having a frame-shaped case member on a top plate of a cooler so that the internal structure disposed on the top plate is enclosed and a thermosetting resin is filled in a space enclosed by the top plate and the case member to seal the internal structure.

However, in such a semiconductor apparatus, its height is equal to at least a sum of a total height of the cooler and a total height of the case member. Therefore, it is difficult to install the semiconductor apparatus at a location having, for example, a space that is low in the height direction.

The present invention has been made in view of such a circumstance, and it is one of objects to provide a semiconductor apparatus which can have a reduced height.

SUMMARY OF THE INVENTION

A semiconductor apparatus according to one embodiment of the present invention includes a cooler including a bottom plate, a plurality of fins disposed on the bottom plate, and a cover member including a fin cover member and a plate cover member, the fin cover member covering the plurality of fins, the fin cover member having a heat dissipation flat area having a heat dissipation inner surface and a heat dissipation outer surface opposite to each other and parallel to the bottom plate, the heat dissipation inner surface facing the plurality of fins, the plate cover member having a planar shape and surrounding an outer periphery of the fin cover member, the plate cover member being disposed on the bottom plate and having a plate cover surface at a side opposite to a side where the bottom plate is disposed. The cooler has a flow path for a coolant formed by a space enclosed by the bottom plate, the plurality of fins and the cover member. The apparatus further includes an insulating substrate disposed on the heat dissipation outer surface of the cover member of the cooler; a semiconductor element disposed on the insulating substrate; and an insulating member disposed on the plate cover surface of the cooler, to seal the insulating substrate and the semiconductor element. The plate cover surface of the cooler is position closer to the bottom plate than is the heat dissipation outer surface of the cooler with respect to a height direction orthogonal to the bottom plate.

According to the present invention, a height of a semiconductor apparatus can be reduced.

DETAILED DESCRIPTION OF THE PREFERRED EMBODIMENTS

A semiconductor apparatus to which the present invention is applicable is described below. Hereinafter, identical or similar numbers refer to common or corresponding parts, and repetitive description is omitted.

Figure 1:
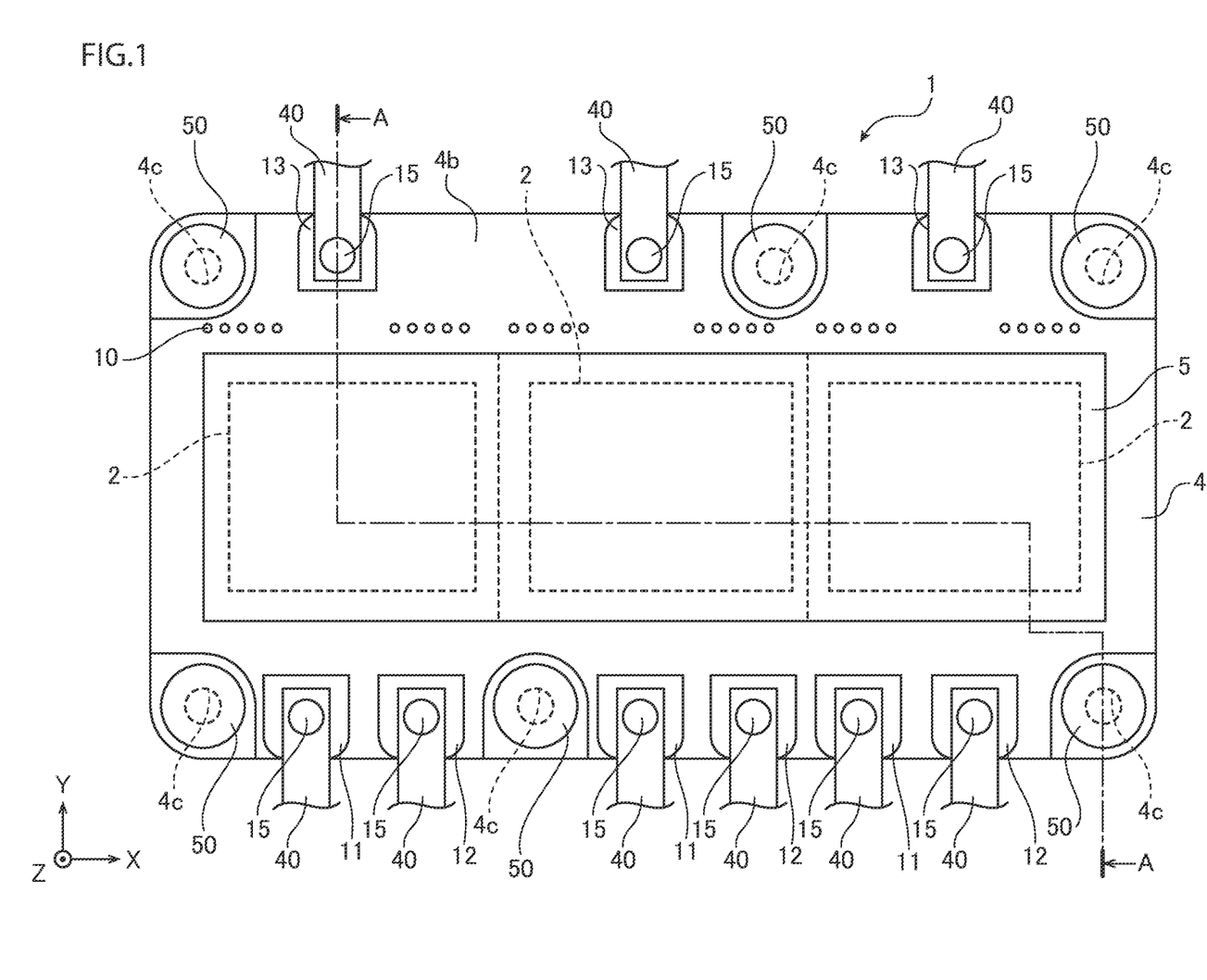
FIG. 1 is a plan view schematically showing a semiconductor apparatus according to one embodiment of the present invention.
Figure 2:
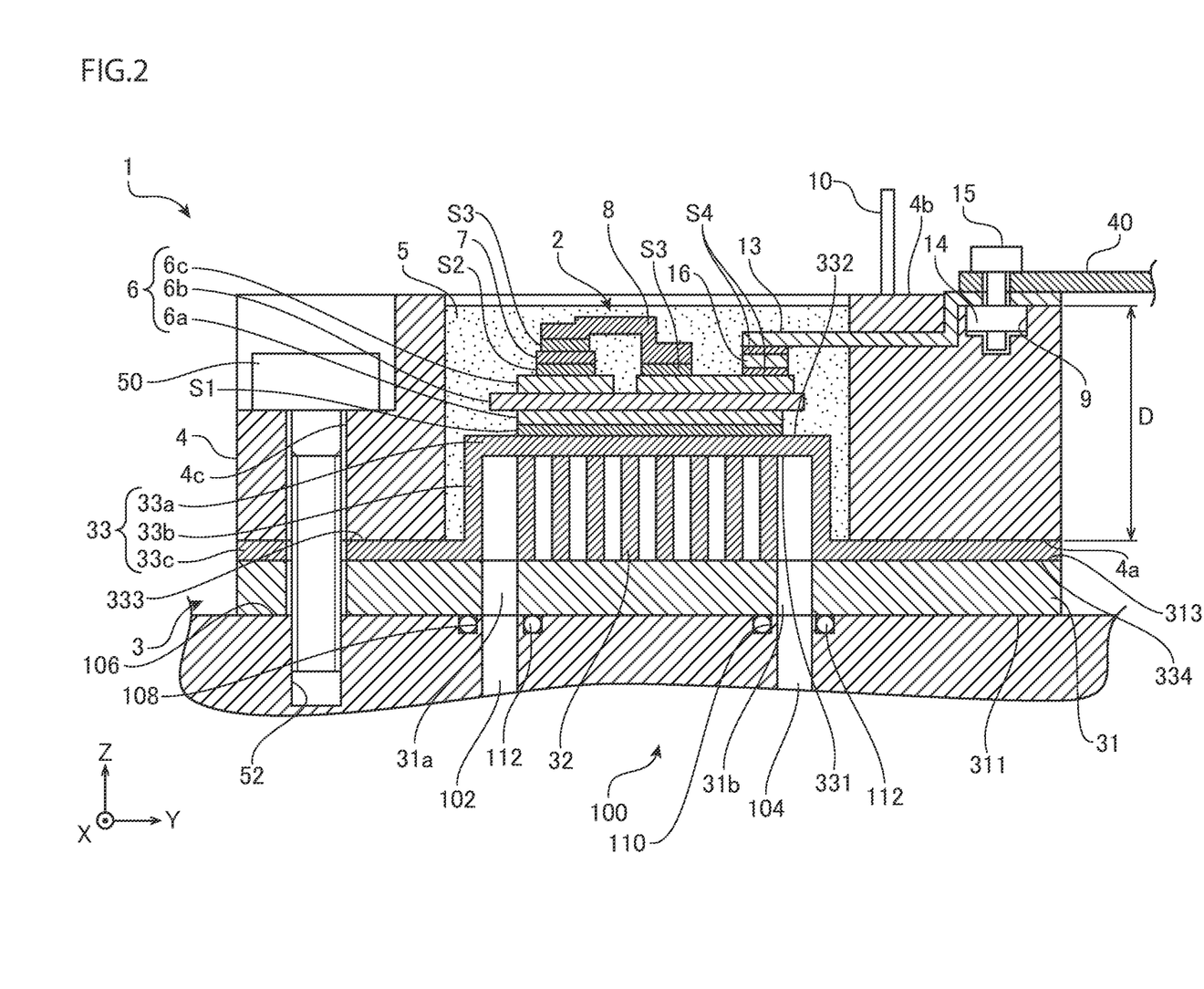
FIG. 2 is a cross-sectional view of the semiconductor apparatus according to the embodiment of the present invention.

FIG. 1 is a plan view schematically showing a semiconductor apparatus 1 according to one embodiment of the present invention. FIG. 2 is a cross-sectional view taken at a line A-A in FIG. 1, which shows an internal structure of the semiconductor apparatus 1. For convenience, FIG. 2 also shows a cross section of a housing 100 of an inverter apparatus in which the semiconductor apparatus 1 is installed. The semiconductor apparatus 1, which is described below, is merely an example, and the semiconductor apparatus according to the present invention is not limited thereto but can be changed as required.

In the following description, a longitudinal direction (or a direction in which a plurality of semiconductor modules 2 are aligned), a shorter direction and a height direction of the semiconductor apparatus 1 are defined as an X direction, a Y direction and a Z direction, respectively. The X, Y, Z directions are orthogonal to each other and form a right-handed system. For convenience of description, a Z-direction positive side (side indicated by an arrow head) is also called an "upper side", and a Z-direction negative side is also called a "lower side". These designations of the directions are designations used for convenience of description of a relative positional relationship between constituent elements and do not indicate absolute directions. For example, the Z direction (top-bottom direction) is not always limited to a vertical direction but may be, for example, a horizontal direction. The expression "planer view" herein refers to a view from the Z-direction positive side of an upper surface of the semiconductor apparatus 1.

In each of drawings, references are not always given to all elements. More specifically, when a plurality of identical elements are shown within one drawing, a reference is given only to partial representative elements, and references for the remaining elements may be omitted. For example, in FIG. 1, a reference numeral "10" is given to partial control terminals 10 of a plurality of control terminals 10, and the reference numeral "10" is not given to the remaining control terminals 10.

The semiconductor apparatus 1 according to one embodiment of the present invention is applied to a power converter such as a power module and is a power module included in an inverter circuit. As shown in FIG. 1 and FIG. 2, the semiconductor apparatus 1 includes a plurality of (three in this embodiment) semiconductor modules 2, a cooler 3 that cools those semiconductor modules 2, a case member 4 that accommodates those semiconductor modules 2, and a sealing resin 5 filled into the case member 4.

Each of the semiconductor modules 2 includes an insulating substrate 6, a semiconductor element 7 disposed on the insulating substrate 6, and a metallic wiring plate 8 disposed on the semiconductor element 7. According to this embodiment, three semiconductor modules 2 are aligned side by side in the X direction. The three semiconductor modules 2 configure a U phase, a V phase and a W phase from, for example, the X-direction positive side and form a three-phase inverter circuit as a whole.

Figure 3:
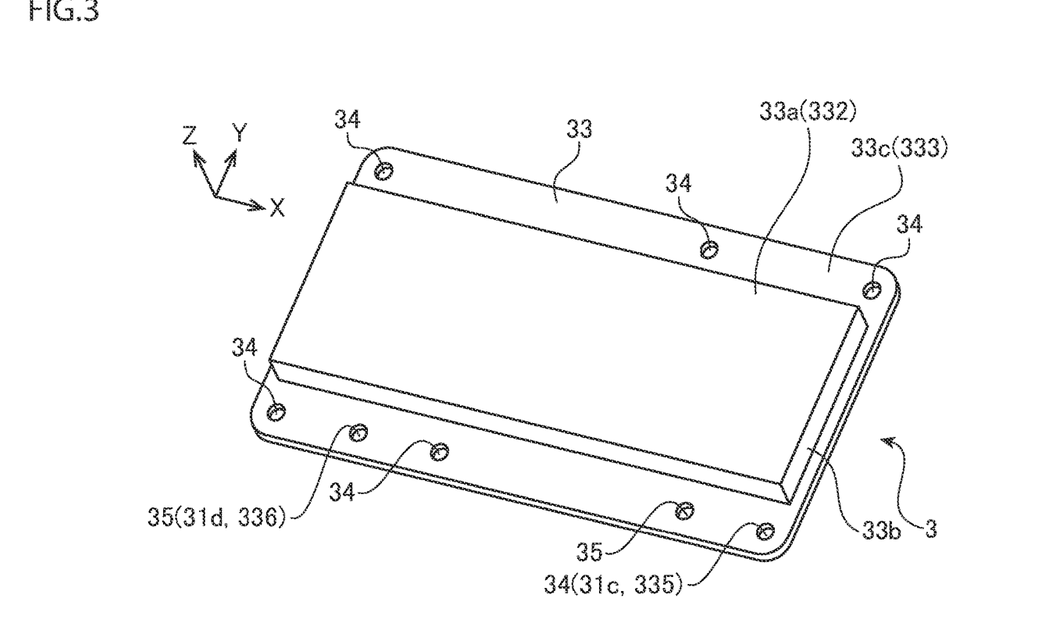
FIG. 3 is an upper perspective view of a cooler according to the embodiment of the present invention.
Figure 4:
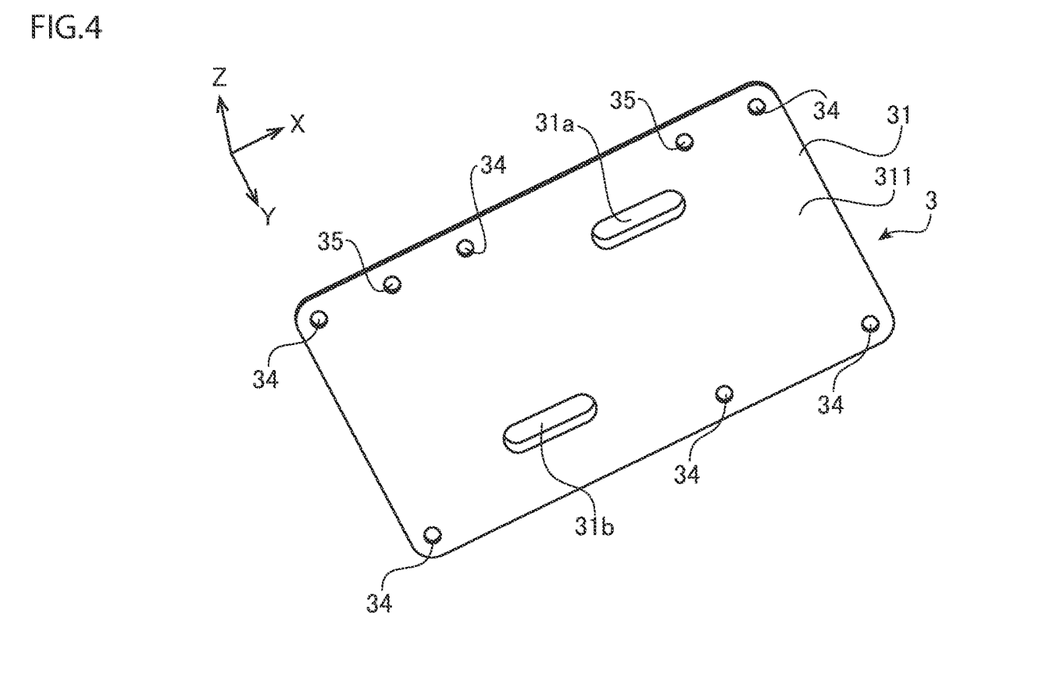
FIG. 4 is a lower perspective view of the cooler according to the embodiment of the present invention.

FIG. 3 is an upper perspective view of the cooler 3. FIG. 4 is a lower perspective view of the cooler 3. The cooler 3 has a rectangular shape in planer view. The cooler 3 includes a bottom plate 31, a plurality of fins 32 disposed on the bottom plate 31, and a cover member 33 that covers the plurality of fins 32.

The cooler 3 has a flow path for a coolant for cooling the semiconductor modules 2, which is formed by a space enclosed by the bottom plate 31, the plurality of fins 32 and the cover member 33.

The cover member 33 has a heat dissipation area having a heat dissipation inner surface 331 opposite the bottom plate 31 with the plurality of fins 32 in between (in a different expression, a heat dissipation inner surface 331 that defines a flow path for a coolant in an upper part of the plurality of fins 32 (a lower surface of the cover member 33)). The insulating substrate 6 is bonded to a heat dissipation outer surface 332 (an upper surface of the cover member 33) on the side opposite to the heat dissipation inner surface 331 of the cover member 33 with a bonding material S1 such as solder or a sintering paste.

The insulating substrate 6 is configured by, for example, a direct copper bonding (DCB) substrate, an active metal brazing (AMB) substrate or a metallic base substrate. In more detail, the insulating substrate 6 has a heat dissipation plate 6a, an insulating plate 6b provided on an upper surface of the heat dissipation plate 6a, and a circuit plate 6c provided on an upper surface of the insulating plate 6b. The insulating substrate 6 has, for example, a rectangular shape in planer view.

The heat dissipation plate 6a is provided to have a predetermined thickness in the Z direction and to cover a lower surface of the insulating plate 6b. The heat dissipation plate 6a is formed by a metallic plate having good heat conductivity of, for example, copper or aluminum.

The insulating plate 6b is formed by, for example, an insulating material such as a ceramics material such as alumina ($Al_2O_3$), aluminum nitride (AlN) or silicon nitride ($Si_3N_4$), a resin material such as epoxy, or an epoxy resin material having a ceramics material as a filler. It should be noted that the insulating plate 6b may be called an insulating layer or an insulating film.

The circuit plate 6c is a metallic layer of, for example, a copper foil, and, for example, a plurality of circuit plates 6c are provided on the insulating plate 6b. The circuit plates 6c are formed in island shapes, which are electrically insulated from each other, on the insulating plate 6b.

The semiconductor element 7 is bonded to the upper surface of the circuit plate 6c with a bonding material S2 such as solder or a sintering paste. In other words, the semiconductor element 7 is disposed on the heat dissipation outer surface 332 of the cover member 33 through the insulating substrate 6. The semiconductor element 7 has a back-surface electrode on its back side, and the back-surface electrode is electrically connected to the circuit plate 6c through the bonding material S2. It should be noted that the bonding material S2 is formed by, for example, the same material as that of the bonding material S1. The bonding material S2 may be a sintered material of, for example, gold, silver or copper.

The semiconductor element 7 has a rectangular shape in planer view formed by a semiconductor substrate of, for example, silicon (Si), silicon carbide (SiC), gallium nitride (GaN) or diamond.

The semiconductor element 7 is, for example, a switching element such as an insulated gate bipolar transistor (IGBT) or a power metal oxide semiconductor field effect transistor (MOSFET). This type of semiconductor element 7 has, for example, a positive electrode as a main electrode on its back surface and a negative electrode as a main electrode on its front surface.

The semiconductor element 7 may be a diode element such as Schottky barrier diode (SBD) or a P-intrinsic-N (PiN) diode. This type of semiconductor element 7 has a cathode electrode as a main electrode on its back surface and an anode electrode as a main electrode on its front surface. Alternatively, as the semiconductor element 7, a reverse conducting (RC)—IGBT in which an IGBT and a free wheeling diode (FWD) are configured as one chip, a reverse blocking (RB)—IGBT having a sufficient resistance to pressure against a reverse bias or the like may be used.

The shape, number, positions and so on of the semiconductor element 7 can be changed as required. It should be noted that the semiconductor element 7 according to this embodiment may be a vertical switching element having function elements such as a transistor on the semiconductor substrate or may be a horizontal switching element.

The metallic wiring plate 8 has one end bonded to the upper surface electrode of the semiconductor element 7 with a bonding material S3 such as solder or a sintering paste. The metallic wiring plate 8 configures main wiring through which main current flows. The metallic wiring plate 8 is formed by, for example, press processing by using a metallic material such as a copper material, a copper-alloy-based material, an aluminum-alloy-based material or an iron-alloy-based material.

The metallic wiring plate 8 has another end, for example, bonded, with the bonding material S3, to another circuit plate 6c that is different from the circuit plate 6c having the semiconductor element 7 thereon. To the different circuit plate 6c, one end of a main terminal (one of a P terminal 11, an N terminal 12 and an M terminal 13) for external connection is bonded with a bonding material S4 such as solder or a sintering paste or through the bonding material S4 and a metallic block 16. According to this embodiment, the circuit plate 6c and one end of the main terminal 11-13 for external connection are bonded by using both of the bonding material S4 and the metallic block 16. It should be noted that the shape of the metallic wiring plate 8 shown in FIG. 2 is merely an example and can be changed as required. The metallic wiring plate 8 is, for example, a lead frame, a clip, a ribbon, a wire or the like.

The case member 4 has a rectangular frame shape that is open at its center and that follows an external shape of the cooler 3 (or the cover member 33). The case member 4 is formed of, for example, a thermoplastic resin such as a polyphenylene sulfide resin (PPS resin) or a polybutylene terephthalate resin (PBT resin).

The case member 4 is bonded to a plate cover surface 333 (which is described below) at an outer edge portion of the cover member 33 with an adhesive (not shown). Thus, the three semiconductor modules 2 disposed on the heat dissipation outer surface 332 (the upper surface of the cover member 33) in the central part of the cover member 33 are accommodated in the central opening of the case member 4. In other words, the case member 4 is disposed on the cooler 3 and is a frame-shaped case member that surrounds the semiconductor modules 2 each including the insulating substrate 6 and the semiconductor element 7.

As the adhesive for bonding a bonded surface (lower surface 4a) of the case member 4 and the plate cover surface 333 of the cover member 33, for example, a silicone-based adhesive or an epoxy-based adhesive is used. A filler such as ceramics may be mixed into the adhesive. By bonding the lower surface 4a of the case member 4 and the plate cover surface 333 of the cover member 33 with the adhesive, leakage of the sealing resin 5 filled within the case member 4 can be prevented.

A control terminal 10 for control and the main terminals (P terminal 11, N terminal 12 and M terminal 13) for external connection are attached to the case member 4. The terminals 10 to 13 are formed by a metallic material such as a copper material, a copper-alloy-based material, an aluminum-alloy-based material or an iron-alloy-based material. Ni plating treatment may be performed on surfaces of the terminals 10 to 13 for improvement of wettability of solder or rust prevention.

The control terminal 10 is embedded by insert molding in a wall on the Y-direction positive side of a pair of walls opposite each other in the shorter direction (Y direction) of the case member 4. The control terminal 10 has one end electrically connected to a control electrode of the semiconductor element 7 via a wiring member such as a wire within the semiconductor module 2. The one end of the control terminal 10 may be electrically connected to a control IC that controls the semiconductor element 7 via a wiring member such as a wire within the semiconductor module 2. A middle part between one end and another end of the control terminal 10 is embedded in the case member 4. The other end of the control terminal 10 extends from an upper surface 4b of the case member 4. The other end of the control terminal 10 may be electrically connected to an external driver circuit, not shown. For example, 10 control terminals 10 are provided for one semiconductor module 2.

The P terminal 11 and N terminal 12 of the main terminals for external connection are embedded by insert molding in a wall on the Y-direction negative side of the pair of walls opposite each other in the shorter direction (Y direction) of the case member 4. The M terminal 13 is embedded by insert molding in a wall on the Y-direction positive side of the pair of walls opposite each other in the shorter direction (Y direction) of the case member 4. As described above, one ends of the main terminals 11 to 13 are bonded to the circuit plate 6c through the bonding material S4 and the metallic block 16 within the semiconductor module 2. In more detail, one end of the P terminal 11 is electrically connected to a collector electrode of an upper arm of the switching element having upper and lower arms. One end of the N terminal 12 is electrically connected to an emitter electrode of the lower arm of the switching element having the upper and lower arms. One end of the M terminal 13 is electrically connected to an emitter electrode of the upper arm and a collector electrode of the lower arm of the switching element having the upper and lower arms. Middle parts between the one ends and the other ends of the main terminals 11 to 13 are embedded in the case member 4. The other ends of the main terminals 11 to 13 extend from the upper surface 4b of the case member 4 toward side surfaces of the case member 4 and reach the side surfaces of the case member 4.

In this way, the main terminals 11 to 13 have the other ends extending to outside from the upper surface 4b of the case member 4 and reaching the side surfaces of the case member 4 and, with the sealing resin 5 filled within the case member 4, the one ends being sealed in the sealing resin 5 and being electrically connected to the semiconductor element 7, as is described below.

The upper surface 4b of the case member 4 has a plurality of concave portions 9, and a nut 14 is fitted into each of the plurality of concave portions 9. Each of the concave portions 9 may also be called a "nut holder". The concave portions 9 hold the nuts 14 for fixing external bus bars 40 with bolts 15 to the main terminals 11 to 13 for external connection. The external bus bars 40 are electrically connected to an external apparatus, not shown. Thus, the other ends of the main terminals 11 to 13 are electrically connected to the external apparatus through the external bus bars 40.

A total of three main terminals of the P terminal 11, the N terminal 12 and the M terminal 13 are connected to one semiconductor module 2. According to this embodiment, because three semiconductor modules 2 are provided, a total of nine main terminals are provided, and nine concave portions 9 are provided.

As described above, the one ends of the main terminals 11 to 13 are bonded to the circuit plate 6c through the bonding material S4 and the metallic block 16. On the other hand, the other ends of the main terminals 11 to 13 have holes for fastening. The other ends of the main terminals 11 to 13 are disposed on the upper surface 4b of the case member 4 such that the holes for fastening are concentric with the nuts 14 held in the concave portions 9. Furthermore, on the upper surfaces of the other ends of the main terminals 11 to 13, the holes for fastening in the main terminals 11 to 13 and the holes for fastening in the external bus bars 40 are disposed so as to be concentric with each other, and the bolts 15 are inserted therethrough. Each of the bolts 15 is also inserted through the nut 14. With the nuts 14 and the bolts 15, the external bus bars 40 are fastened to the main terminals 11 to 13. Thus, the other ends of the main terminals 11 to 13 are mechanically and electrically connected to the external bus bars 40.

The aforementioned shapes, positions, numbers and so on of the terminals 10 to 13 are merely examples. The shapes, positions, numbers and so on of the terminals 10 to 13 are not limited to the examples above but can be changed as required.

The sealing resin 5 is filled in the space defined by the lower surface 4a of the case member 4 and the plate cover surface 333 of the cover member 33 which are bonded to each other. The upper surface of the sealing resin 5 is positioned at an equal or lower (Z-direction negative side) level of the upper surface 4b of the case member 4. Thus, the components of the semiconductor modules 2 are sealed within the space above. The sealing resin 5 seals at least the insulating substrate 6, the semiconductor element 7, a section from the one ends of the main terminals 11 to 13 to the parts embedded in the case member 4, and the heat dissipation outer surface 332 and plate cover surface 333 of the cover member. Thus, an insulation property between the semiconductor element 7, the circuit plate 6c and the main terminals 11 to 13 and the cover member 33 can be maintained.

In this way, the case member 4 and the sealing resin 5 are configured as an insulating member that seals the components of the semiconductor module 2.

The sealing resin 5 is formed of a thermosetting resin. The sealing resin 5 preferably contains at least one of epoxy, silicone, urethane, polyimide, polyamide, and polyamide-imide. As the sealing resin 5, for example, an epoxy resin to which a filler is mixed is preferable from viewpoint of its insulation property, heat resistance property and heat dissipation property.

The case member 4 has a plurality of (six in this embodiment) through-holes 4c along its outer circumferential edge. The through-holes 4c are holes for inserting therethrough bolts 50 for fixing the semiconductor apparatus 1.

Next, a detail configuration of the cooler 3 is described.

The bottom plate 31 is a flat plate-shaped body (that is, a flat plate) having a rectangular shape in planer view and a predetermined thickness. The bottom plate 31 has an external shape corresponding to the external shape of the case member 4. In other words, the bottom plate 31 has a longitudinal part extending in the right-left direction (X direction) of the semiconductor apparatus 1 and a shorter part extending in the front-back direction (Y direction) of the semiconductor apparatus 1. The bottom plate 31 has an outer circumferential end surface extending up to the side surfaces of the case member 4. The bottom plate 31 is, for example, formed of an aluminum alloy having good heat dissipation property. Ni plating treatment may be performed on the surface of the bottom plate 31 for rust prevention and so on. The plate thickness of the bottom plate 31 is preferably thicker than the plate thickness of the cover member 33, details of which are described below.

An inlet portion 31a for introducing a coolant to a flow path included in the cooler 3 and a discharge portion 31b for discharging the coolant from the flow path are provided at predetermined positions of the bottom plate 31. The inlet portion 31a and the discharge portion 31b are formed by through-holes extending through the bottom plate 31 in the thickness direction. Each of the inlet portion 31a and the discharge portion 31b has a long-hole shape that is long in the X direction in planar view. The inlet portion 31a and the discharge portion 31b are disposed so as to be opposite each other diagonally with the plurality of fins 32 in between in the Y direction. The shapes and positions of the inlet portion 31a and discharge portion 31b are not limited thereto but can be changed as required.

As shown in FIG. 2, the housing 100 of the inverter apparatus has an inlet-portion-side flow path 102 that communicates with the inlet portion 31a and a discharge-portion-side flow path 104 that communicates with the discharge portion 31b. A coolant that is introduced from the inlet-portion-side flow path 102 through the inlet portion 31a to the flow path within the cooler 3 is discharged through the discharge portion 31b to the discharge-portion-side flow path 104.

According to this embodiment, the inlet portion 31a and discharge portion 31b for a coolant do not project from the sides of the bottom plate 31 but are provided in the lower surface 311 of the bottom plate 31. Thus, without using a special jointer or the like but only by attaching the semiconductor apparatus 1 to the housing 100 of the inverter apparatus where the semiconductor apparatus 1 is to be installed, the cooler 3 and the coolant flow path of the inverter apparatus where the semiconductor apparatus 1 is to be installed can be connected. Therefore, the configuration can be simplified, and the number of man-hours for the attachments can be reduced.

The bottom plate 31 has a plurality of (six in this embodiment) through-holes 31c along its outer circumferential edge. The through-holes 31c are holes for inserting therethrough the bolts 50 for fixing the semiconductor apparatus 1.

Figure 5:
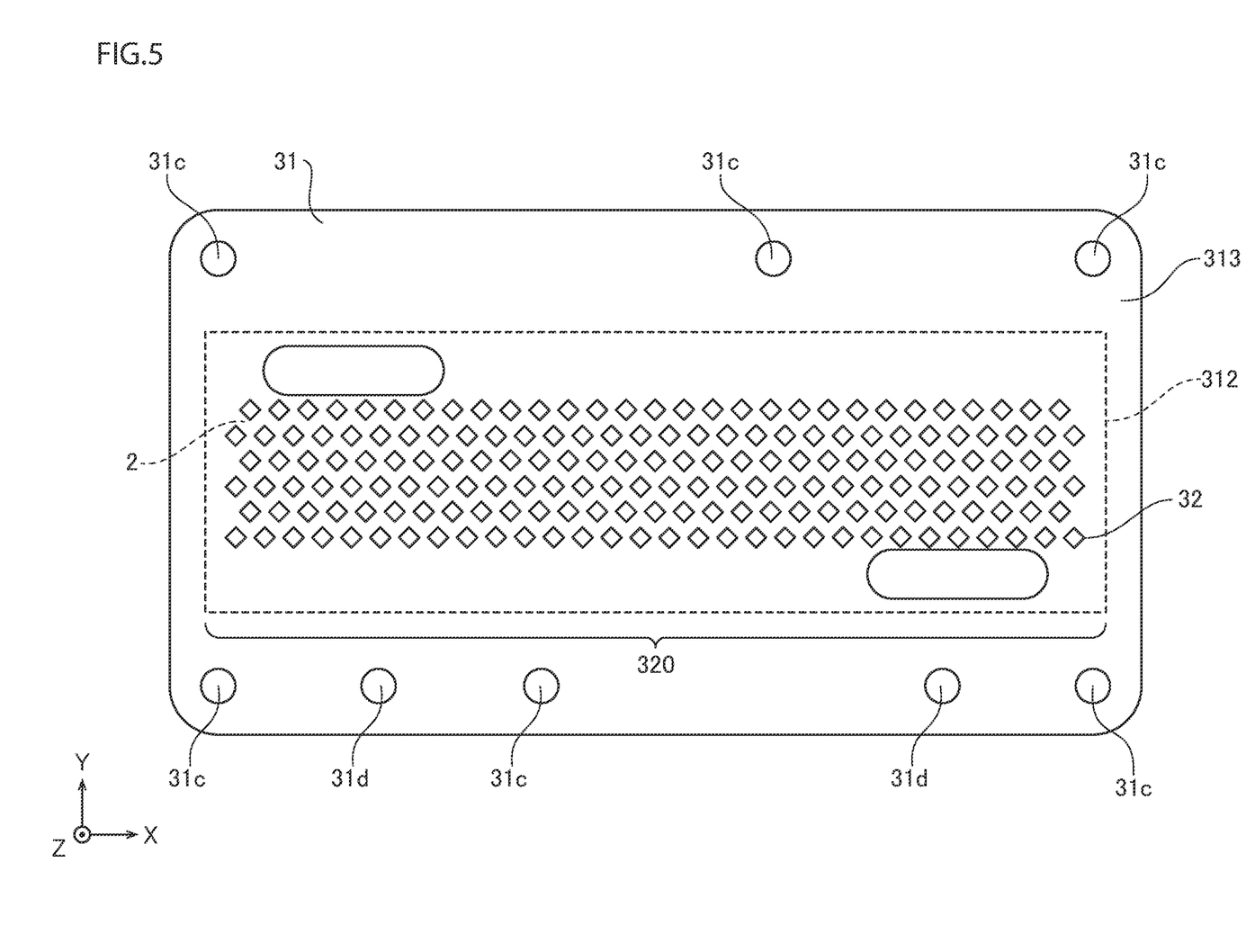
FIG. 5 is a plan view of the cooler according to the embodiment of the present invention where a cover member in the cooler is not shown.

FIG. 5 is a plan view showing the cooler 3 where the cover member 33 is not shown, that is, only showing the bottom plate 31 and the plurality of fins 32 of the cooler 3.

As shown in FIG. 5, the bottom plate 31 has an upper-surface central portion (planer-view rectangular region 312 (region enclosed by a broken line in FIG. 5)) at a center of the upper surface and an upper-surface circumferential edge portion (planer-view circumferential edge region 313) at an outer circumference of the planer-view rectangular region 312. The planer-view rectangular region 312 has the plurality of fins 32 (a collection 320 of the fins 32), the inlet portion 31a and the discharge portion 31b. The planer-view rectangular region 312 is a region opposite a top plate 33a of the cover member 33, which is described below, where a coolant flows. The planer-view circumferential edge region 313 is a region to be bonded by, for example, brazing to a lower surface 334 of a plate-shaped portion 33c of the cover member 33, which is described below.

The fins 32 are, for example, prism-shaped pins (square pins). The plurality of fins 32 are spaced at predetermined pitches in the planer-view rectangular region 312 at the upper-surface center of the bottom plate 31. Thus, in the planer-view rectangular region 312, a coolant flows from the inlet portion 31a through flow paths between the plurality of fins 32 and is discharged from the discharge portion 31b. The collection 320 of the fins 32 has an external shape having a substantially rectangular parallelepiped shape internally contained in the planer-view rectangular region 312. The external shape of the collection 320 is not limited to the substantially rectangular parallelepiped shape but may have any other shape.

In more detail, each of the fins 32 has a rhombus shape in planer view, and the facing direction of a pair of corners opposite each other on a diagonal line agrees with the shorter direction (Y direction) of the cooler 3. The fins 32 project by a predetermined length from the upper surface of the bottom plate 31 toward the Z-direction positive side. Preferably, the fins 32 have a length from the upper surface (planer-view rectangular region 312) of the bottom plate 31 to the heat dissipation inner surface 331 of the top plate 33a of the cover member 33, which is described below. The configuration of the fins 32 is not limited thereto but can be changed as required. For example, the shape of the fins 32 may be a cylinder, a truncated pyramid or a truncated cone instead of the prism shown in FIG. 5. The collection 320 may have a configuration in which a plurality of blade-shaped fins 32 extending in the Y direction are arranged at predetermined pitches in the X direction.

The fins 32 are formed of, for example, the same metallic material as that of the bottom plate 31. The fins 32 may be brazed or implanted to the planer-view rectangular region 312 at the upper-surface center of the bottom plate 31 or may be integrated to the bottom plate 31 by cutting, forging or casting. In the latter case, the cooler 3 includes two parts (an integral part of the bottom plate 31 and the fins 32 and the cover member 33). Thus, the configuration of the cooler 3 can be simplified, and the number of man-hours for manufacturing and manufacturing costs can be reduced. Preferably, tips of the fins 32 integrated to the bottom plate 31 are brazed to the heat dissipation inner surface 331 of the top plate 33a. If the bottom plate 31 and the fins 32 are separate parts, the fins 32 have one ends brazed to the upper surface of the bottom plate 31 and the other ends brazed to the heat dissipation inner surface 331 of the top plate 33a, for example.

As shown in FIG. 3, the cover member 33 is a plate-shaped body having a rectangular shape in planer view and a convex shape in cross-section view having a predetermined thickness. The cover member 33 includes the top plate 33a, a circumferential wall portion 33b, and the plate-shaped portion 33c. The top plate 33a and the circumferential wall portion 33b bay be provided as a fin cover member, and the plate-shaped portion 33c may be provided as a plate cover member. The top plate 33a is a portion that projects upward at the center part of the cover member 33. The circumferential wall portion 33b is a frame-shaped portion that connects in the Z direction an outer circumference of the top plate 33a positioned above and an inner circumference of the plate-shaped portion 33c positioned below. The plate-shaped portion 33c is a portion that is positioned below in the outer circumferential part of the cover member 33. The external shape of the cover member 33 also corresponds to the external shape of the case member 4, like the bottom plate 31. In other words, also, the outer circumferential end surface of the cover member 33 extends to the side surfaces on the lower surface 4a side of the case member 4. The thicknesses of the top plate 33a, the circumferential wall portion 33b and the plate-shaped portion 33c may be substantially equal. Alternatively, the thickness of the plate-shaped portion 33c is thicker than that of the top plate 33a.

The outer circumferential end surface of the bottom plate 31 and the outer circumferential end surface of the plate-shaped portion 33c constructing the outer circumferential end surface of the cooler 3 extend up to the side surfaces of the case member 4 such that the outer circumferential end surface of the cooler 3 and the side surfaces of the case member 4 are flush with each other.

The top plate 33a, the circumferential wall portion 33b and the plate-shaped portion 33c may be an integral sheet metal processed product. The cover member 33 is, for example, made of an aluminum alloy having a good heat dissipation property, like the bottom plate 31. Ni plating treatment may be performed on the surface of the cover member 33 for improvement of wettability of solder, rust prevention and so on.

As shown in FIG. 2, the semiconductor modules 2 are disposed on the heat dissipation outer surface 332 of the top plate 33a that is the uppermost surface of the cover member 33. Thus, heat caused by the semiconductor modules 2 is mainly transmitted to the cover member 33. Therefore, as the thickness of the cover member 33 decreases, the heat dissipation performance of the cooler 3 increases. Accordingly, the plate thickness of the cover member 33 is preferably equal to or larger than 0.5 mm and smaller than 2 mm.

The top plate 33a has an area that occupies the whole of the planer-view rectangular region 312 at the upper-surface center of the bottom plate 31 and is disposed above the collection 320 so as to cover all of the plurality of fins 32 (collection 320). The lower surface of the top plate 33a is the heat dissipation inner surface 331 that defines a flow path for a coolant above the collection 320. Each of the plurality of fins 32 is brazed to the heat dissipation inner surface 331 of the cover member 33. It should be noted that the cover member 33 may be integrated to the plurality of fins 32 by cutting processing or casting. Here, the bottom plate 31 and the plurality of fins 32 are separately formed parts rather than an integrally formed product.

The insulating substrate 6 is bonded with the bonding material S1 to the heat dissipation outer surface 332 of the top plate 33a (upper surface of the top plate 33a) on the opposite side of the heat dissipation inner surface 331. In other words, the three semiconductor modules 2 aligned in the X direction are disposed on the upper surface of the top plate 33a. Heat caused by the three semiconductor modules 2 is mainly transmitted to the top plate 33a and is cooled by a coolant flowing in the flow path in the cooler 3 from the heat dissipation inner surface 331 of the top plate 33a and the fins 32.

The circumferential wall portion 33b has a rectangular frame shape along the outer circumferential edge of the top plate 33a. The circumferential wall portion 33b extends up to an end side on the inner circumferential side of the plate-shaped portion 33c because of its shape projecting in the Z-direction negative side from the end side of the top plate 33a. Thus, the circumferential wall portion 33b surrounds the outer circumference of the plurality of fins 32 (collection 320) positioned below the top plate 33a. The whole of the collection 320 is covered by the top plate 33a, the circumferential wall portion 33b and the bottom plate 31.

The projection height in the Z-direction negative side of the circumferential wall portion 33b is equal to or larger than the projection height of the fins 32. Preferably, the projection height in the Z-direction negative side of the circumferential wall portion 33b is substantially equal to the projection height of the fins 32. The projection height in the Z-direction negative side of the circumferential wall portion 33b provides a distance between the heat dissipation inner surface 331 of the top plate 33a and the planer-view rectangular region 312 at the upper-surface center of the bottom plate 31 (in other words, the entire length in the Z direction of the space defined by the top plate 33a, the circumferential wall portion 33b and the bottom plate 31). Therefore, the fins 32 extend across the entire length in the Z direction of the defined space (that is, from the planer-view rectangular region 312 to the heat dissipation inner surface 331). As a result, a wide surface area of the fins 32 can be secured within the space, which improves the heat dissipation performance of the cooler 3.

The projection height of the fins 32 is preferably equal to or larger than 3 mm and equal to or smaller than 20 mm. If the projection height of the fins 32 is smaller than 3 mm, the surface area of the fins 32 is small, which reduces the heat dissipation performance of the cooler 3. If the projection height of the fins 32 exceeds 20 mm, it is difficult to have a reduced entire height of the semiconductor apparatus 1 because the height position of the top plate 33a is high.

The plate-shaped portion 33c extends to outside of the portion covering the plurality of fins 32 (collection 320) (that is, the box-shaped body constructed by the top plate 33a and the circumferential wall portion 33b). In more detail, the plate-shaped portion 33c extends from the entire circumference of the lower end of the circumferential wall portion 33b to outside of the box-shaped body along the XY plane. Thus, the height position in the Z direction of the upper surface (plate cover surface 333) of the plate-shaped portion 33c is lower than the upper surface (heat dissipation outer surface 332) of the top plate 33a which is positioned at the equal height to that of the upper end of the circumferential wall portion 33b. In other words, with respect to the height direction (Z direction) from the bottom plate 31 to the heat dissipation inner surface 331, the upper surface of the plate-shaped portion 33c is lower in the height position than the upper surface of the top plate 33a.

The external shape of the plate-shaped portion 33c provides a maximum external shape of the cover member 33 in planer view and corresponds to the external shape of the case member 4. The plate-shaped portion 33c may be provided so as to face and overlap the circumferential edge part of the upper surface of the bottom plate 31 (planer-view circumferential edge region 313) that surrounds the planer-view rectangular region 312 at the upper-surface center of the bottom plate 31 in planer view. The planer-view circumferential edge region 313 of the bottom plate 31 and the lower surface 334 of the plate-shaped portion 33c are bonded by, for example, brazing. Thus, a lower opening of the box-shaped body constructed by the top plate 33a and the circumferential wall portion 33b is closed by the bottom plate 31, and a flow path for a coolant for cooling the semiconductor modules 2 is formed by the space enclosed by the bottom plate 31, the plurality of fins 32 and the cover member 33.

The plate-shaped portion 33c has a plurality of (six in this embodiment) through-holes 335 along its outer circumferential edge. The through-holes 335 are holes for inserting therethrough the bolts 50 for fixing the semiconductor apparatus 1. The bottom plate 31 and the plate-shaped portion 33c are bonded such that the through-holes 31c of the bottom plate 31 and the through-holes 335 respectively corresponding to the through-holes 31c are concentric. For convenience, reference numeral "34" is given to each of through-holes formed by communication of the through-holes 31c and the through-holes 335.

The case member 4 having a rectangular frame shape in planer view is bonded to the upper surface (plate cover surface 333) of the plate-shaped portion 33c having a rectangular frame shape in planer view with an adhesive. Thus, the three semiconductor modules 2 are accommodated in the central opening of the case member 4, and the top plate 33a and the circumferential wall portion 33b constructing the box-shaped body are also accommodated in the central opening of the case member 4.

In this way, the case member 4 is disposed on the upper surface (plate cover surface 333) of the plate-shaped portion 33c that is lower in height position than the upper surface (heat dissipation outer surface 332) of the top plate 33a being the uppermost surface of the cover member 33. Thus, according to this embodiment, as shown in FIG. 2, the height of the semiconductor apparatus 1 can be lower than the total height of the entire height of the cooler 3 and the entire height of the case member 4. Therefore, the semiconductor apparatus 1 can be installed in a part having, for example, a low space in the height direction (Z direction).

A difference in height position in the Z direction between the upper surface (heat dissipation outer surface 332) of the top plate 33a and the upper surface (plate cover surface 333) of the plate-shaped portion 33c is preferably equal to or larger than 3 mm and equal to or smaller than 20 mm. If the difference in height position is smaller than 3 mm, only the fins 32 having a short entire length can be disposed within the cooler 3. Here, because the surface area of the fins 32 is small, the heat dissipation performance of the cooler 3 decreases. Also, it is difficult to secure a creeping distance (details of which are described below) between the cooler 3 and the main terminals 11 to 13. If the difference in height position exceeds 20 mm, it is difficult to have a reduced entire height of the semiconductor apparatus 1 because the height position of the top plate 33a is high.

The case member 4 is bonded to the upper surface (plate cover surface 333) of the plate-shaped portion 33c such that the plurality of through-holes 4c are concentric with the corresponding through-holes 34. The bolts 50 for fixing are inserted to the through-holes formed by communication of the through-holes 4c and the through-holes 34. The housing 100 of the inverter apparatus has a female threaded hole 52 in which a female thread is provided on its inner circumferential surface. By fastening the tip of the bolt 50 inserted to the through-hole formed by communication of the through-hole 4c and the through-hole 34 to the female threaded hole 52, the semiconductor apparatus 1 is fixed to the housing 100 of the inverter apparatus.

Because the cooler 3 is made of a metallic material, a creeping distance between the semiconductor modules 2 and the cooler 3 is required to be secured. More specifically, a creeping distance (indicated by the reference character "D" in FIG. 2) between the main terminals 11 to 13 exposed from the insulative sealing resin 5 and the cooler 3 is required to be secured.

According to this embodiment, the main terminals 11 to 13 extend up to the side surfaces on the upper surface 4b side of the case member 4. The outer circumferential end surface of the cooler 3 extends up to the side surfaces on the lower surface 4a side of the case member 4. In order to secure the creeping distance D, a large height dimension of the case member 4 (that is, the dimension from the lower surface 4a to the upper surface 4b of the case member 4) is required. Therefore, for securing the creeping distance D, it is difficult to reduce the entire height of the semiconductor apparatus in the conventional configuration (the configuration in which the case member is disposed on the top plate of the cooler). On the other hand, according to this embodiment, the case member 4 is disposed on the upper surface (plate cover surface 333) of the plate-shaped portion 33c which is lower than the upper surface (heat dissipation outer surface 332) of the top plate 33a. Therefore, it is easy to have a reduced entire height of the semiconductor apparatus even when the case member 4 has a large height dimension for securing the creeping distance D.

An installed surface 106 of the housing 100 of the inverter apparatus in which the semiconductor apparatus 1 is to be installed has a flat surface having groove portions 108 and 110 that are ring-shaped in planer view. The groove portion 108 is provided so as to surround an opening of the inletportion-side flow path 102 in the installed surface 106. The groove portion 110 is provided so as to surround an opening of the discharge-portion-side flow path 104 in the installed surface 106.

An O-ring 112 is fitted into each of the groove portions 108 and 110. The semiconductor apparatus 1 is attached to the installed surface 106 through the O-rings 112 and is fixed to the housing 100 with the bolts 50 inserted to the through-holes formed by communication of the through-holes 4c and the through-holes 34. It should be noted that, upon attachment to the housing 100, the lower surface 311 of the bottom plate 31 is brought into contact with the installed surface 106. The sealing between the installed surface 106 and the lower surface 311 is acquired with the O-ring 112.

When the semiconductor apparatus 1 is fixed to the housing 100 with the bolts 50, the bottom plate 31 may not resist the reaction force of the O-ring 112 and may be deformed because the bottom plate 31 has low rigidity if the bottom plate 31 is excessively thin. When the bottom plate 31 is deformed, the sealing between the installed surface 106 and the lower surface 311 of the bottom plate 31 cannot be guaranteed. Accordingly, in order to prevent this type of deformation, the plate thickness of the bottom plate 31 is preferably equal to or larger than 2 mm. In this way, in order to prevent losing the sealing because of the deformation, the plate thickness of the bottom plate 31 is thicker than the plate thickness of the cover member 33. The plate thickness of the bottom plate 31 is preferably equal to or smaller than 10 mm. If the plate thickness of the bottom plate 31 is thicker than 10 mm, the entire thickness of the semiconductor apparatus 1 is thick, and the entire weight is also heavy, which is not preferable.

Figure 6:
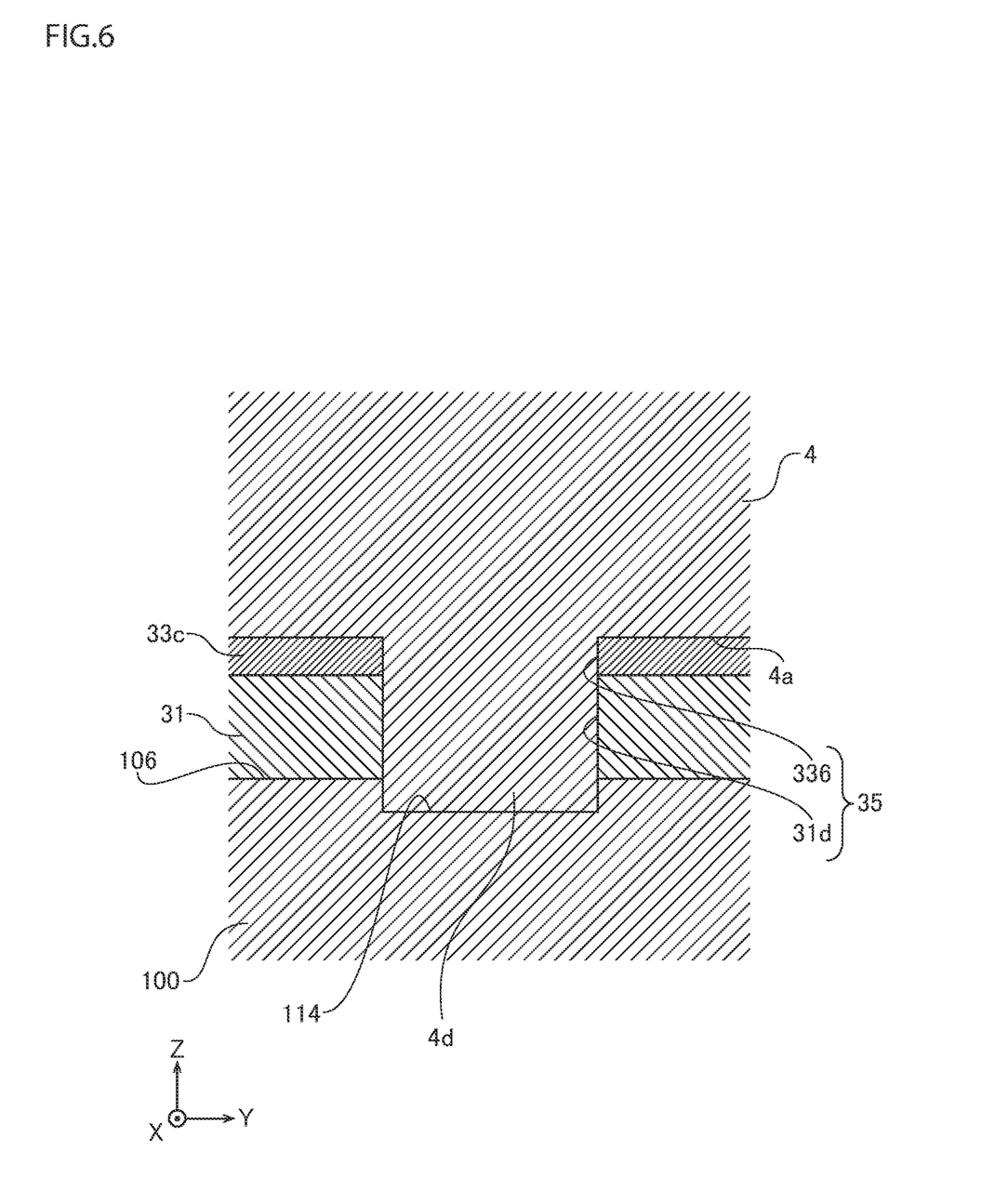
FIG. 6 is a cross-sectional view of a partial configuration of the semiconductor apparatus according to the embodiment of the present invention.

As shown in FIG. 3 and FIG. 4, the cooler 3 has a pair of through-holes 35 extending in the Z direction. Each of the through-holes 35 is a through-hole formed by communication of a through-hole 31d in the bottom plate 31 and a through-hole 336 in the plate-shaped portion 33c. FIG. 6 shows a cross-sectional view of a partial configuration (configuration including the through-hole 35) of the semiconductor apparatus 1. For convenience, FIG. 6 also shows a cross section of the housing 100 of the inverter apparatus in which the semiconductor apparatus 1 is to be installed.

As shown in FIG. 6, the lower surface 4a of the case member 4 has bosses 4d projecting in the Z-direction negative side. Each of the bosses 4d is provided at a position corresponding to each of the pair of through-holes 35 in planer view. Each of the bosses 4d is inserted to the corresponding through-hole 35. With the pair of bosses 4d inserted to the corresponding through-holes 35, the positions in the X direction and the Y direction of the case member 4 are determined with respect to the cooler 3.

The installed surface 106 of the housing 100 has concave portions 114. The concave portions 114 are provided at positions corresponding to the pair of bosses 4d. A tip of the boss 4d inserted through the through-hole 35 is inserted to the concave portion 114. Thus, the positions in the X direction and the Y direction of the semiconductor apparatus 1 are determined with respect to the installed surface 106.

According to this embodiment, as described above, the case member 4 is disposed on the upper surface (plate cover surface 333) of the plate-shaped portion 33c which is lower in height position than the upper surface (heat dissipation outer surface 332) of the top plate 33a being the uppermost surface of the cover member 33 so that the semiconductor apparatus 1 can have a reduced height.

Having described that, according to the aforementioned embodiment, the insulating substrate 6 and the semiconductor element 7 are configured so as to have a rectangular shape in planer view, the present invention is not limited thereto. These components may have a polygonal shape other than the rectangular shape in planer view.

Having described the configuration in which three unit modules are aligned in the X direction in order of a U phase, a V phase and a W phase according to the aforementioned embodiment, the present invention is not limited thereto. The number of aligned unit modules and the direction of the alignment can be changed as required.

Figure 7:
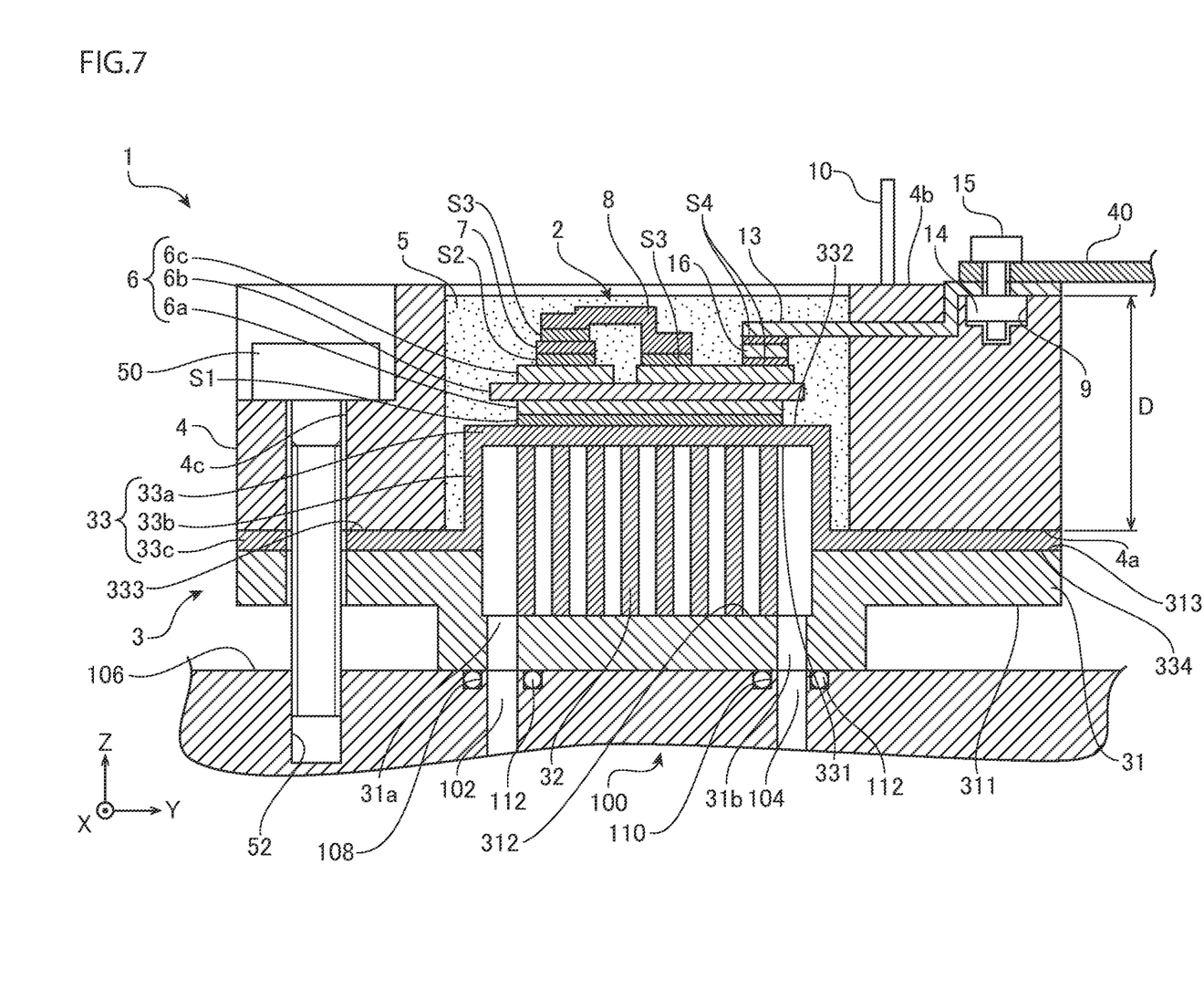
FIG. 7 is a cross-sectional view of a semiconductor apparatus according to Variation Example 1 of the present invention.

FIG. 7 is a cross-sectional view showing an internal structure of a semiconductor apparatus 1 according to Variation Example 1 of the aforementioned embodiment. The semiconductor apparatus 1 according to Variation Example 1 has a planer-view rectangular region 312 positioned at the center of the bottom plate 31 forming a surface further recessed in the Z-direction negative side with respect to the planer-view circumferential edge region 313 positioned at the outer circumference of the planer-view rectangular region 312. In other words, the bottom plate 31 has an upper-surface central region (the planer-view rectangular region 312) having a shape projecting in the direction away from the heat dissipation inner surface 331 with respect to an upper-surface circumferential edge region (the planer-view circumferential edge region 313), instead of a flat plate like the one in the aforementioned embodiment. Furthermore, according to Variation Example 1, the fins 32 have a shape extending from the heat dissipation inner surface 331 of the top plate 33a to the planer-view rectangular region 312 which is further recessed with respect to the planer-view circumferential edge region 313. In other words, according to Variation Example 1, compared with the aforementioned embodiment, because the entire length in the Z direction of the fins 32 is long and a wide surface area of the fins 32 is secured, the heat dissipation performance of the cooler 3 is further improved.

Figure 8:
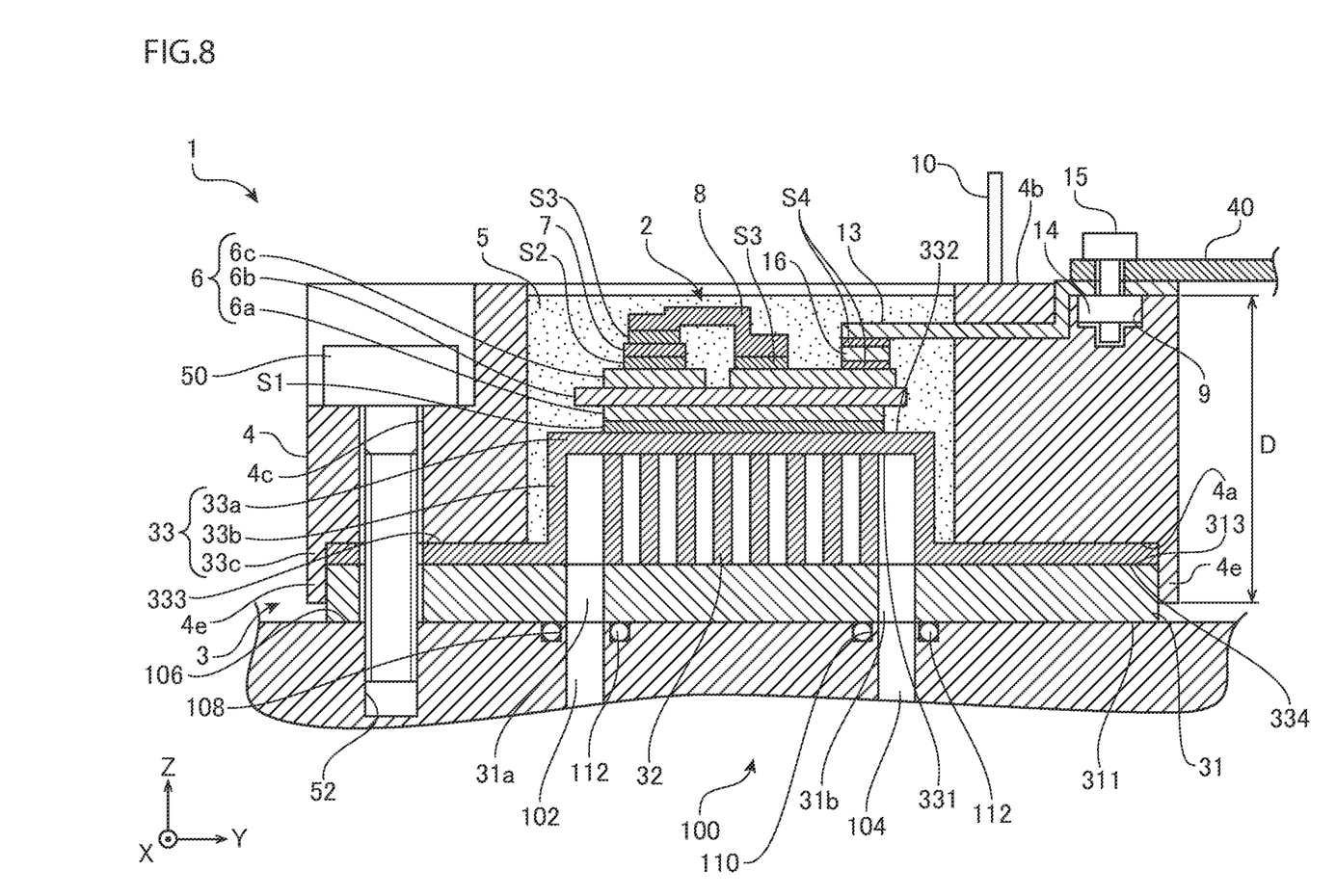
FIG. 8 is a cross-sectional view of a semiconductor apparatus according to Variation Example 2 of the present invention.

FIG. 8 is a cross-sectional view showing an internal structure of a semiconductor apparatus 1 according to Variation Example 2 of the aforementioned embodiment. According to Variation Example 2, the case member 4 has a projection portion 4e (skirt portion) projecting in the Z-direction negative side from the lower surface 4a of the case member 4 (the surface for bonding to the upper surface (plate cover surface 333) of the plate-shaped portion 33c) in the entire circumference of the side surfaces of the case member 4.

The projection portion 4e covers at least a partial outer circumferential end surface close to the case member 4 of the outer circumferential end surface of the cooler 3 in the entire circumference of the outer circumferential end surface of the cooler 3. More specifically, a substantially upper half of the outer circumferential end surface of the cooler 3, which is exposed immediately below the case member 4, is covered by the projection portion 4e of the case member 4 that is a resin member. For that, as shown in FIG. 8, the creeping distance D extends from the upper surface 4b of the case member 4 where the main terminals 11 to 13 are disposed to the outer circumferential end surface position of the cooler 3, which is not covered by the projection portion 4e (exposed to outside) beyond the lower surface 4a of the case member 4.

In other words, according to Variation Example 2, a longer creeping distance D than that of the aforementioned embodiment is acquired. For that, application to a high-voltage apparatus that requires a long creeping distance D is enabled. When the creeping distance D is configured to be equal to that of the aforementioned embodiment, the height dimension of the case member 4 (that is, the dimension from the lower surface 4a to the upper surface 4b of the case member 4) can be reduced, and the entire height of the semiconductor apparatus 1 can further be reduced, compared with the aforementioned embodiment.

Figure 9:
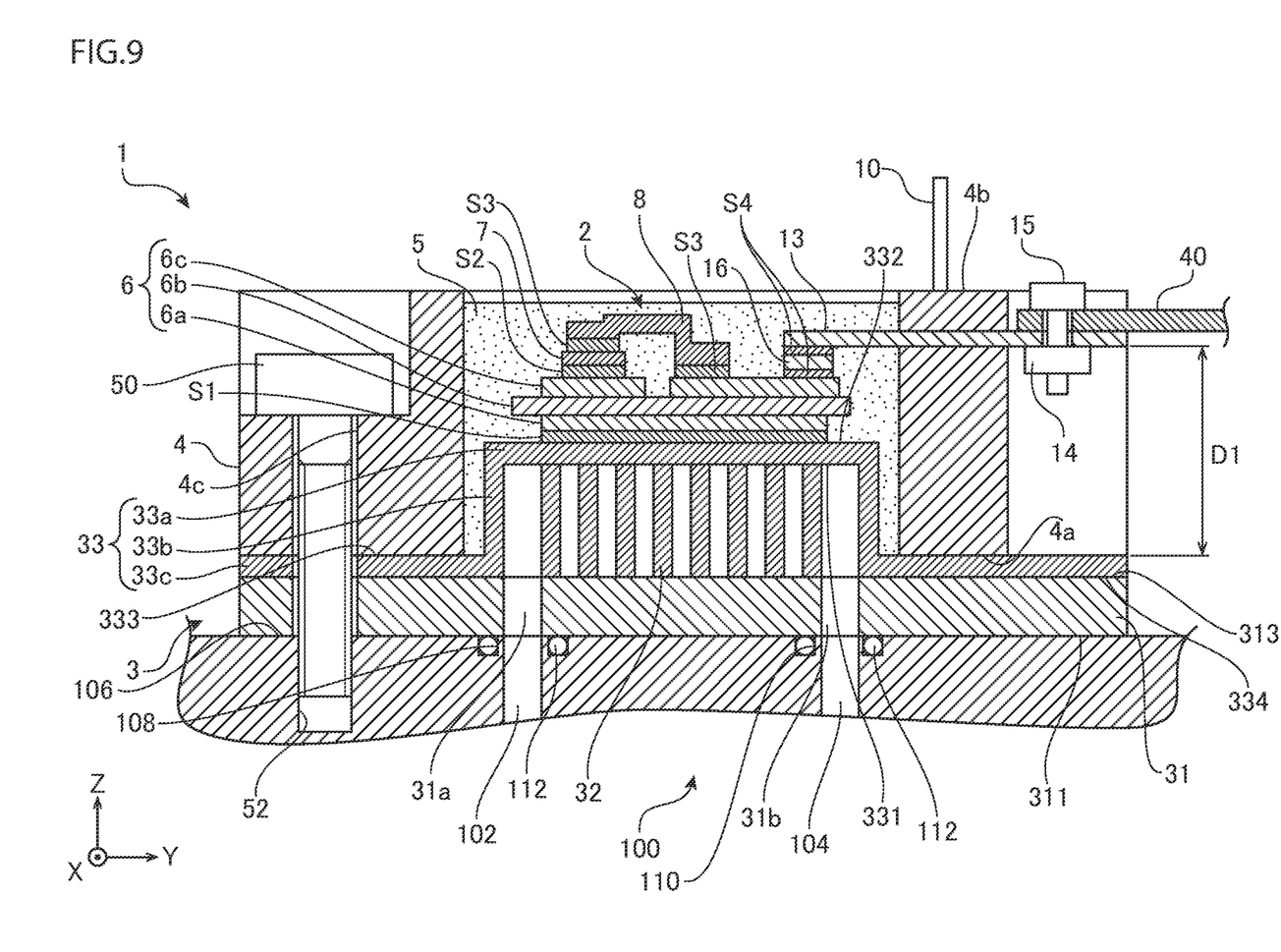
FIG. 9 is a cross-sectional view of a semiconductor apparatus according to Variation Example 3 of the present invention.

FIG. 9 is a cross-sectional view showing an internal structure of a semiconductor apparatus 1 according to Variation Example 3 of the aforementioned embodiment. According to Variation Example 3, the main terminals 11 to 13 have one ends being sealed in the sealing resin 5 and being electrically connected to the semiconductor element 7 and extending linearly in the Y direction through the case member 4 and the other ends extending from the side surfaces of the case member 4 to outside. A middle part between the one ends and the other ends of the main terminals 11 to 13 is embedded by insert molding in the case member 4. In this way, according to Variation Example 3, the main terminals 11 to 13 from the one ends to the other ends have a simple linear shape without a bending part, which is advantageous for reduction of the man-hours for manufacturing and the manufacturing costs.

Figure 10:
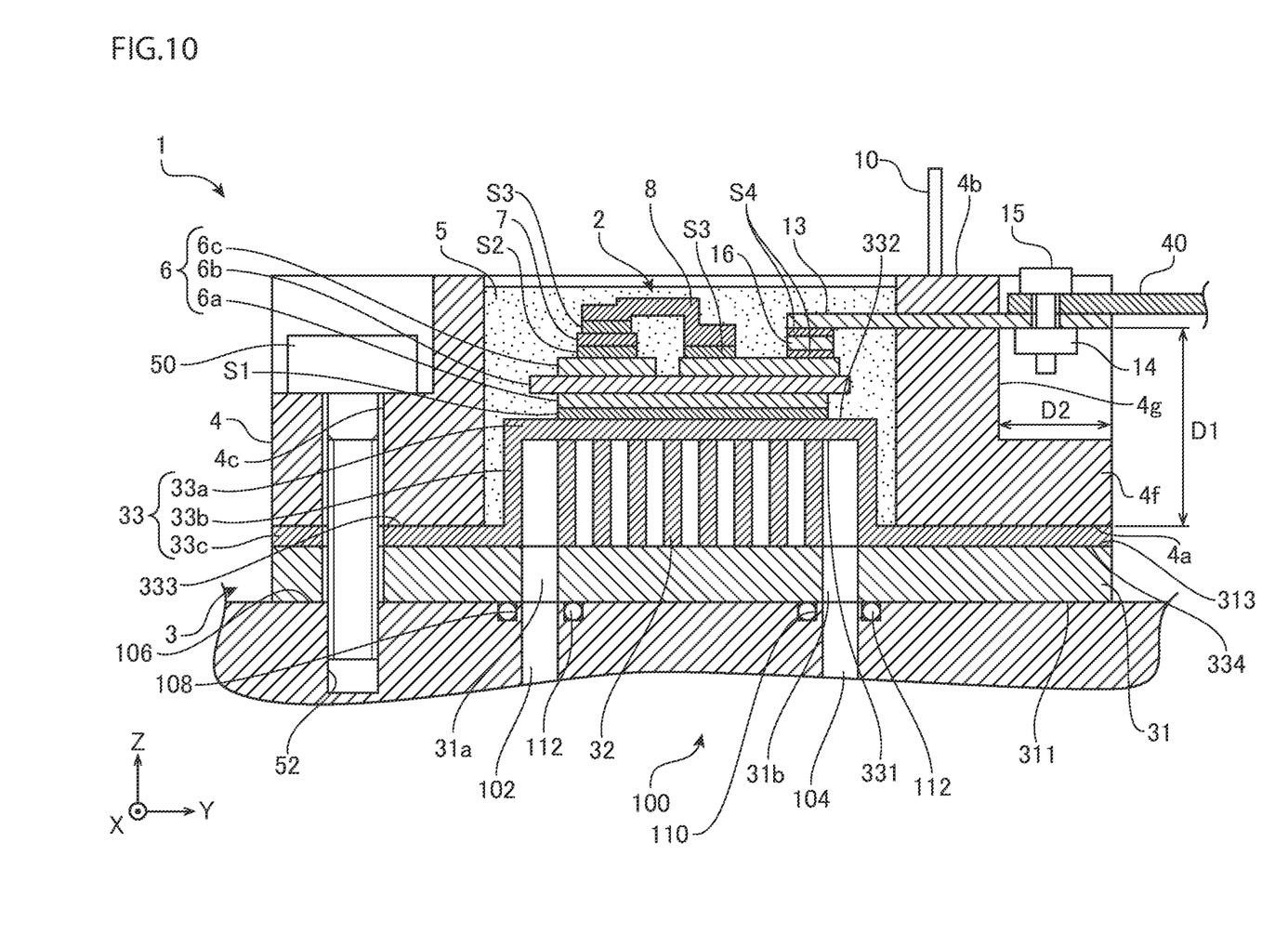
FIG. 10 is a cross-sectional view of a semiconductor apparatus according to Variation Example 4 of the present invention.

FIG. 10 is a cross-sectional view showing an internal structure of a semiconductor apparatus 1 according to Variation Example 4 of the aforementioned embodiment. According to Variation Example 4, the main terminals 11 to 13 have a linear shape, like Variation Example 3. Here, in Variation Example 3, the case member 4 has a gouged shape immediately below the other ends of the main terminals 11 to 13 and is not interposed between the cover member 33 and the other ends of the main terminals 11 to 13. Thus, in Variation Example 3, the creeping distance D is a distance D1 from the plate cover surface 333 of the cover member 33 to the lower surfaces of the other ends of the main terminals 11 to 13. On the other hand, the case member 4 of Variation Example 4 has an outer edge portion 4f immediately below the other ends of the main terminals 11 to 13. The case member 4 has a shape including a first side surface 4g provided in an inner part from the outer circumferential end surface of the cooler 3 and the outer edge portion 4f provided in an outer part from the first side surface 4g immediately below the other ends of the main terminals 11 to 13. Thus, the creeping distance D is a distance that is a sum of the distance D1 above and a dimension D2 in the depth direction (Y direction) of the outer edge portion 4f.

In other words, according to Variation Example 4, a longer creeping distance D than that of Variation Example 3 is acquired. Therefore, application to a high-voltage apparatus that requires a long creeping distance D is enabled. When the creeping distance D is configured to be equal to that of Variation Example 3, the height dimension of the case member 4 (that is, the dimension from the lower surface 4a to the upper surface 4b of the case member 4) can be reduced, and the entire height of the semiconductor apparatus 1 can further be reduced, compared with Variation Example 3.

Having described the embodiment and variation examples, all or a part of the embodiment and the variation examples may be combined as other embodiments.

Embodiments are not limited to the aforementioned embodiment and variation examples, but various changes, replacements and variations can be made thereto without departing from the spirit and scope of the technical idea. Furthermore, if the technical idea can be realized by a different method with an advance of the technology or a different technology derived therefrom, the technical idea can be implemented by using the method. Therefore, the claims cover all embodiments that can be included within the scope of the technical idea.

For example, having described the semiconductor apparatus 1 according to the embodiment including the case member 4 having the rectangular frame shape that is open at its center and the sealing resin 5 filled within the case member 4, the present invention is not limited thereto. The case member 4 may be integrated to the sealing resin 5. Here, by using a molding resin and a molding die, the components of the semiconductor module 2 are molded to produce the semiconductor apparatus 1.

Characteristic points according to the aforementioned embodiments are organized below.

A semiconductor apparatus according to the aforementioned embodiment includes a cooler having a bottom plate, a plurality of fins disposed on the bottom plate, and a cover member covering the plurality of fins, the cover member having a heat dissipation inner surface opposite the bottom plate with the plurality of fins in between, the cooler having a flow path for a coolant formed by a space enclosed by the bottom plate, the plurality of fins and the cover member, a semiconductor element disposed on a heat dissipation outer surface of the cover member through an insulating substrate, the heat dissipation outer surface being positioned on an opposite side of the heat dissipation inner surface, and an insulating member being disposed on the cooler and sealing the insulating substrate and the semiconductor element. The cover member has a plate-shaped portion extending outward from a portion covering the plurality of fins, and the plate-shaped portion is bonded to the bottom plate, the plate-shaped portion has a plate cover surface, the insulating member is bonded onto the plate cover surface, and the plate cover surface is a surface lower in height position than the heat dissipation outer surface with respect to a height direction from the bottom plate to the heat dissipation inner surface.

The semiconductor apparatus according to the aforementioned embodiment further includes a terminal provided in the insulating member. The terminal has one end being sealed in the insulating member and being electrically connected to the semiconductor element and another end extending from an upper surface or a side surface of the insulating member to outside.

The semiconductor apparatus according to the aforementioned embodiment further includes a terminal provided in the insulating member. The terminal has one end being sealed in the insulating member and being electrically connected to the semiconductor element and another end having a shape extending from an upper surface of the insulating member to outside and reaching a side surface of the insulating member.

The semiconductor apparatus according to the aforementioned embodiment further includes a terminal provided in the insulating member. The terminal has one end being sealed in the insulating member and being electrically connected to the semiconductor element and another end having a shape extending from a side surface of the insulating member to outside and extending linearly from the one end to the other end.

In the semiconductor apparatus according to the aforementioned embodiment, the bottom plate has a plate thickness thicker than a plate thickness of the cover member.

In the semiconductor apparatus according to the aforementioned embodiment, the plate thickness of the bottom plate is equal to or larger than 2 mm.

In the semiconductor apparatus according to the aforementioned embodiment, the plate thickness of the cover member is equal to or larger than 0.5 mm and smaller than 2 mm.

In the semiconductor apparatus according to the aforementioned embodiment, a difference in height position between the heat dissipation outer surface and the plate cover surface is equal to or larger than 3 mm and equal to or smaller than 20 mm.

In the semiconductor apparatus according to the aforementioned embodiment, a lower surface of the insulating member and the plate cover surface of the cover member are bonded with an adhesive.

In the semiconductor apparatus according to the aforementioned embodiment, a boss is provided on a lower surface of the insulating member, and the bottom plate and the plate-shaped portion have a hole through which the boss is to be inserted.

In the semiconductor apparatus according to the aforementioned embodiment, the bottom plate and the plurality of fins are integrated.

In the semiconductor apparatus according to the aforementioned embodiment, the cover member and the plurality of fins are integrated.

In the semiconductor apparatus according to the aforementioned embodiment, the insulating member includes a frame-shaped case member surrounding the insulating substrate and the semiconductor element and a sealing resin sealing, in an inner part of the case member, the insulating substrate, the semiconductor element, and the heat dissipation outer surface and plate cover surface of the cover member.

In the semiconductor apparatus according to the aforementioned embodiment, the plurality of fins are provided in an upper-surface central portion of the bottom plate, and the plate-shaped portion has a surface on an opposite side of the plate cover surface, the surface being brazed to an upper-surface circumferential edge portion surrounding the upper-surface central portion of the bottom plate.

In the semiconductor apparatus according to the aforementioned embodiment, the bottom plate has the upper-surface central portion having a shape projecting in a direction away from the heat dissipation surface with respect to the upper-surface circumferential edge portion.

In the semiconductor apparatus according to the aforementioned embodiment, the bottom plate is a flat plate.

In the semiconductor apparatus according to the aforementioned embodiment, an outer circumferential end surface of the bottom plate and an outer circumferential end surface of the plate-shaped portion construct an outer circumferential end surface of the cooler, and the outer circumferential end surface of the cooler and a side surface of the insulating member are flush with each other.

In the semiconductor apparatus according to the aforementioned embodiment, an outer circumferential end surface of the bottom plate and an outer circumferential end surface of the plate-shaped portion construct an outer circumferential end surface of the cooler, the insulating member has a projection portion projecting from a surface bonded to the plate cover surface in an entire circumference of a side surface of the insulating member, and the projection portion covers at least a partial outer circumferential end surface close to the insulating member of the outer circumferential end surface of the cooler in an entire circumference of the outer circumferential end surface of the cooler.

In the semiconductor apparatus according to the aforementioned embodiment, an outer circumferential end surface of the bottom plate and an outer circumferential end surface of the plate-shaped portion construct an outer circumferential end surface of the cooler, and the insulating member has a shape including a first side surface provided in an inner part from the outer circumferential end surface of the cooler and an outer edge portion provided in an outer part from the first side surface immediately below the terminal.

INDUSTRIAL APPLICABILITY

As described above, the present invention has an effect that an apparatus can have a reduced height and is particularly useful for a semiconductor apparatus.

REFERENCE SIGNS LIST

1: semiconductor apparatus
2: semiconductor module
3: cooler
4: case member
4d: boss
5: sealing resin
6: insulating substrate
6a: heat dissipation plate
6b: insulating plate
6c: circuit plate
7: semiconductor element
8: metallic wiring plate
9: nut holder
10: control terminal
11: P terminal
12: N terminal
13: M terminal
14: nut
15: bolt
31: bottom plate
31a: inlet portion
31b: discharge portion
32: fin
33: cover member
33a: top plate
33b: circumferential wall portion
33c: plate-shaped portion
100: housing
102: inlet-portion-side flow path
104: discharge-portion-side flow path
108, 110: grove portion
112: O-ring
114: concave portion

The invention claimed is:
1. A semiconductor apparatus, comprising:
a cooler including
a bottom plate,
a plurality of fins disposed on the bottom plate, and
a cover member including a fin cover member and a plate cover member, the fin cover member covering the plurality of fins, the fin cover member having a heat dissipation flat area having a heat dissipation inner surface and a heat dissipation outer surface opposite to each other and parallel to the bottom plate, the heat dissipation inner surface facing the plurality of fins, the plate cover member having a planar shape and surrounding an outer periphery of the fin cover member, the plate cover member being disposed on the bottom plate and having a plate cover surface at a side opposite to a side where the bottom plate is disposed, wherein the cooler has a flow path for a coolant formed by a space enclosed by the bottom plate, the plurality of fins and the cover member;

an insulating substrate disposed on the cover member at the heat dissipation outer surface;

a semiconductor element disposed on the insulating substrate; and an insulating member disposed on the cooler to cover the plate cover surface and the heat dissipation outer surface so as to seal the insulating substrate and the semiconductor element, wherein the plate cover surface is positioned closer to the bottom plate than is the heat dissipation outer surface in a height direction orthogonal to the bottom plate.

2. The semiconductor apparatus according to claim 1, further comprising a terminal provided in the insulating member, wherein the terminal has one end sealed in the insulating member and electrically connected to the semiconductor element, and another end extending from an upper surface or a side surface of the insulating member to outside the insulating member.

3. The semiconductor apparatus according to claim 1, further comprising a terminal provided in the insulating member, wherein the terminal has one end sealed in the insulating member and electrically connected to the semiconductor element, and another end extending from an upper surface of the insulating member to outside the insulating member and reaching a side surface of the insulating member.

4. The semiconductor apparatus according to claim 1, further comprising a terminal provided in the insulating member, wherein the terminal has a linear shape and has one end sealed in the insulating member and electrically connected to the semiconductor element, and another end extending from a side surface of the insulating member to outside the insulating member.

5. The semiconductor apparatus according to claim 1, wherein the bottom plate has a thickness greater than a thickness of the cover member.

6. The semiconductor apparatus according to claim 5, wherein the thickness of the bottom plate is equal to or greater than 2 mm.

7. The semiconductor apparatus according to claim 5, wherein the thickness of the cover member is in a range of 0.5 mm to 2 mm.

8. The semiconductor apparatus according to claim 1, wherein a difference in height of the heat dissipation outer surface and the plate cover surface is in a range of 3 mm to 20 mm.

9. The semiconductor apparatus according to claim 1, wherein a lower surface of the insulating member and the plate cover surface of the plate cover member are bonded with an adhesive.

10. The semiconductor apparatus according to claim 1, wherein the insulating member has a boss protruding from a lower surface thereof toward the bottom plate of the cooler, and the bottom plate and the plate cover member each have a hole in which the boss is inserted.

11. The semiconductor apparatus according to claim 1, wherein the bottom plate and the plurality of fins are integrated.

12. The semiconductor apparatus according to claim 1, wherein the cover member and the plurality of fins are integrated.

13. The semiconductor apparatus according to claim 1, wherein the insulating member includes a frame-shaped case member and a sealing resin, the case member surrounding the insulating substrate and the semiconductor element, the sealing resin being disposed inside the case member on the heat dissipation outer surface and plate cover surface of the plate cover member, and sealing the insulating substrate and the semiconductor element.

14. The semiconductor apparatus according to claim 1, wherein the plurality of fins are provided on an upper surface of the bottom plate at a center portion thereof, and the plate cover member has a surface that is opposite to the plate cover surface and is brazed to the upper surface of the bottom plate at an area surrounding the center portion of the bottom plate in which the plurality of fins are provided.

15. The semiconductor apparatus according to claim 14, wherein the bottom plate has a central portion and a circumferential edge portion surrounding the central portion, the central portion projecting in a direction away from the heat dissipation surface with respect to the circumferential edge portion.

16. The semiconductor apparatus according to claim 1, wherein the bottom plate has a planar shape.

17. The semiconductor apparatus according to claim 1, wherein an outer circumferential end surface of the bottom plate and an outer circumferential end surface of the plate cover member form a circumferential end surface of the cooler, and the outer circumferential end surface of the cooler and a side surface of the insulating member are flush with each other.

18. The semiconductor apparatus according to claim 1, wherein an outer circumferential end surface of the bottom plate and an outer circumferential end surface of the plate cover member form an outer circumferential end surface of the cooler, the insulating member has a projection portion projecting from the outer circumferential end surface of the cooler, and the projection portion covers at least a part of the outer circumferential end surface of the cooler at an area thereof adjacent to the insulating member.

19. The semiconductor apparatus according to claim 2, wherein an outer circumferential end surface of the bottom plate and an outer circumferential end surface of the plate cover member form an outer circumferential end surface of the cooler, and the insulating member has a first side surface and a second side surface, the second side surface being flush with the outer circumferential end surface of the cooler, and the first side surface being located inward than is the position of the outer circumferential end surface of the cooler in a plan view of the semiconductor apparatus.

* * * * *